(12) United States Patent
Torkaman

(10) Patent No.: US 6,874,770 B2
(45) Date of Patent: Apr. 5, 2005

(54) HIGH FLOW RATE BUBBLER SYSTEM AND METHOD

(75) Inventor: Amir Torkaman, Santa Cruz, CA (US)

(73) Assignee: Aviza Technology, Inc., Scotts Valley, CA (US)

( * ) Notice: Subject to any disclaimer, the term of this patent is extended or adjusted under 35 U.S.C. 154(b) by 24 days.

(21) Appl. No.: 10/306,205

(22) Filed: Nov. 27, 2002

(65) Prior Publication Data

US 2003/0116019 A1 Jun. 26, 2003

Related U.S. Application Data

(60) Provisional application No. 60/337,566, filed on Nov. 30, 2001.

(51) Int. Cl.[7] ................................................. B01F 3/04
(52) U.S. Cl. .................... 261/130; 261/142; 261/122.1; 96/251; 96/358
(58) Field of Search ................................. 261/130, 141, 261/142, 121.1, 122.1, 124; 96/245, 251, 300, 351, 356, 358, 360

(56) References Cited

U.S. PATENT DOCUMENTS

| | | | |
|---|---|---|---|
| 1,339,609 A | 5/1920 | Stinson | |
| 1,563,125 A | * 11/1925 | Ward | ........................... 96/358 |
| 4,350,505 A | * 9/1982 | Mallory et al. | ............... 96/249 |
| 4,618,462 A | 10/1986 | Fisher | |
| 4,861,524 A | 8/1989 | Sielaff et al. | |
| 4,968,336 A | 11/1990 | Reimanis et al. | |
| 5,029,471 A | 7/1991 | Goodrich | |
| 5,078,922 A | 1/1992 | Collins et al. | |
| 5,354,347 A | * 10/1994 | McCoy et al. | ................ 96/330 |
| 5,855,775 A | 1/1999 | Kerfoot | |
| 6,083,407 A | 7/2000 | Kerfoot | |
| 6,094,948 A | 8/2000 | Hong et al. | |
| 6,179,277 B1 | 1/2001 | Huston et al. | |
| 6,409,839 B1 | 6/2002 | Sun et al. | |
| 2003/0042630 A1 | * 3/2003 | Babcoke et al. | ......... 261/121.1 |

* cited by examiner

*Primary Examiner*—Scott Bushey
(74) *Attorney, Agent, or Firm*—Dorsey & Whitney LLP

(57) ABSTRACT

A high flow rate bubbler system and method are provided for producing a stable, easily controllable source of chemical vapors to a downstream process. The bubbler system is equipped with a vaporizer unit connected to its gas outlet tube. This vaporizer unit slows the gas velocity to enhance settling of entrained droplets and contacts the exiting gas with a high thermal mass, heated surfaces to promote heat transfer and evaporation of the entrained droplets.

19 Claims, 3 Drawing Sheets

HIGH FLOW RATE BUBBLER SYSTEM AND METHOD

RELATED APPLICATIONS

This application claims the benefit of U.S. Provisional Application Ser. No. 60/337,566, filed on Nov. 30, 2001, the disclosure of which is hereby incorporated by reference in its entirety.

FIELD OF THE INVENTION

The present invention relates generally to an apparatus for generating high flow-rate carrier gas streams saturated or nearly saturated with the vapors of a volatile liquid chemical. More specifically, the present invention provides a high flow rate bubbler having an external liquid phase evaporator particularly suitable for use with semiconductor fabrication equipment and other systems requiring high flow rate and or intermittent delivery of concentration-metered chemical vapors.

BACKGROUND OF THE INVENTION

Apparatuses for generating carrier gas streams containing controlled partial pressures of one or more target gases are used in a variety of industries. For example, bubblers are widely used in the semiconductor industry for delivery of gases to processing equipment. As referred to in U.S. Pat. No. 5,078,922 the disclosure of which is hereby incorporated by reference, a prior bubbler utilizes a carrier gas inlet to which is attached a horizontally oriented sparger tube with a plurality of mechanically formed exit holes through which carrier gas streams enter the liquid chemical. The streams of carrier gas provided by the plurality of small exit holes in the sparger tube bubble up through the liquid chemical. Some of the liquid chemical is vaporized by the carrier gas to form a chemical vapor. Carrier gas and chemical vapors exit the bubbler chamber through a vapor outlet tube.

The inclusion of a sparger on the carrier gas inlet tube improves mass transfer between the liquid and vapor phases in the bubbler chamber by decreasing bubble diameter relative to earlier inlet designs with a single gas inlet hole. Smaller bubbles rise through the liquid chemical more slowly, thus allowing greater time for diffusion of chemical vapors into the bubbles. Additionally, the gas-liquid interfacial area per volumetric flow rate of the carrier gas increases as the bubble diameter decreases. Diffusive flux is directly proportional to the interfacial area, and bubble-liquid interfacial area increases as the inverse of the bubble diameter squared. Thus, for a given volumetric flow rate of carrier gas, mass transfer of vaporized liquid chemical into the carrier gas stream increases as the bubble diameter decreases. However, the minimum bubble diameter achievable with a sparger is limited by the size and number of holes than can be produced by mechanical means in the sparger tube. Alternative and more effective means for generating more numerous streams of smaller bubbles while maintaining high carrier gas flow rates are desirable.

In general, the flow of chemical vapor that may be supplied by a bubbler is governed by the following equation:

$$Q_{Chemical} = Q_{Carrier\ Gas}\left(\frac{P_{vapor}}{P_{Head} - P_{vapor}}\right) \quad (1)$$

where $Q_{Chemical}$ is the volumetric flow rate of the chemical (standard $cm^3$ $minute^{-1}$ or sccm), $Q_{Carrier\ Gas}$ is the volumetric flow rate of the carrier gas (sccm), $P_{vapor}$ is the partial pressure of the chemical at the bubbler temperature, and $P_{Head}$ is the gauge pressure in the bubbler chamber. The rate of chemical vapor production, $Q_{Chemical}$ may be increased by increasing the carrier gas flow rate, $Q_{Carrier\ Gas}$, or by increasing the temperature to increase $P_{vapor}$. Because $P_{Head}$ is also a function of temperature, increases in $Q_{Chemical}$ are most often attained by increasing $Q_{Carrier\ Gas}$. However, prior art bubblers generally have a maximum carrier gas flow rate in the range of approximately 1 to 5 standard liter per minute (slm) depending on the bubbler temperature. Increasing carrier gas flow rates result in splashing and entrainment of liquid droplets into the carrier gas stream.

Increasing the carrier gas flow rate in a prior art bubbler system also generally results in lower gas-phase concentration of the vaporized chemical in the carrier gas stream exiting the bubbler due to increased bubble diameters for a given sparger tube outlet hole size and the resulting decrease in carrier gas residence time in the fluid and cross sectional area for diffusive flux and 2) increased churning of the liquid chemical leading to generation of suspended liquid-phase droplets that may become entrained in the carrier gas flow exiting the bubbler chamber through the vapor outlet tube. Subsequent deposition of these droplets downstream of the bubbler can lead to problems of contamination or poor control of the gas-phase concentration of the chemical vapor.

Alternative methods for generating chemical vapors at high flow rates have been previously developed. These methods include direct liquid injector (DLI) devices. In a DLI, pressurized liquid is delivered to a heated unit that causes rapid volatilization into the flow stream. The concentration of the resulting vapors in the carrier gas stream is a function of the flow rate of the carrier gas through the unit and the liquid into the heated region. Because relatively small variations in the liquid delivery rate of the liquid-mass flow controller may induce large changes in the concentration of delivered vapor in DLI systems, the exact mass flow rate of the chemical is very difficult to control, and often an external closed-loop control system is used in conjunction with the liquid-mass flow controller. In bubbler systems, however, the carrier gas can be easily controlled to achieve an accurate mass flow rate of the chemical since the vapor concentration is fixed by temperature. Variations in the gas flow rate through a bubbler have decidedly smaller impacts on the resultant partial pressure of the chemical vapors in the carrier gas stream. Accordingly, there is a need for an improved bubbler design that would facilitate higher carrier gas throughput rates.

SUMMARY OF THE INVENTION

It is therefore an object of the invention to provide a bubbler that is capable of higher carrier gas flow rates while achieving high liquid to gas phase mass transfer rates. It is another object of the invention to provide a high flow rate bubbler that minimizes entrainment of unevaporated liquid droplets in the carrier gas stream exiting the bubbler.

In accordance with these and other objects of the invention, an improved bubbler is provided for vaporizing a liquid chemical by bubbling a carrier gas through the liquid chemical.

In one embodiment of the present invention, a high flow rate bubbler system is provided. This system includes a bubbler chamber containing a liquid chemical, a gas inlet for delivering carrier gas to the liquid inside the bubbler chamber, a gas outlet conveying carrier gas out of the bubbler chamber, and a vaporizer unit through which carrier gas exits the bubbler chamber. The vaporizer unit comprises one or more heated surfaces that have a substantial thermal mass. These heated surfaces are oriented such that carrier gas passing through the vaporizer unit contacts the heated surfaces for a time sufficient to remove liquid droplets entrained in the carrier gas by either impaction of evaporation or both. The vaporizer unit also has a substantial cross sectional area perpendicular to the direction of carrier gas flow such that the gas velocity is substantially slowed inside the vaporizer unit to enhance gravitational settling of entrained droplets.

In an alternative embodiment of the present invention, a system for substantially removing entrained liquid chemical droplets from a flowing carrier gas is provided. This system comprises a vaporizer unit having a flow chamber through which the general direction of carrier gas flow is from a first side to an opposing second side of the flow chamber. The flow chamber has a high surface area to gas volume ratio such that heat transfer between the high thermal mass surfaces of the flow chamber and the gas flowing through the chamber is very efficient. The chamber also has a large thermal mass that reduces its sensitivity to the cooling effect of gases flowing through it. An inlet port is positioned on the first side of the flow chamber through which the carrier gas flows into the flow chamber. Carrier gas flows out of the flow chamber through an outlet port positioned on the opposing second side of the flow chamber. A temperature controlled heat source is coupled to the flow chamber for elevating and maintaining the temperature of the flow chamber and its high thermal mass interior surfaces.

In a further embodiment, one or more bubbler systems according to the various embodiments of the present invention provide precursor chemical vapors to a chemical vapor deposition system.

In a further embodiment of the current invention, a method is provided for substantially removing entrained liquid chemical droplets from a gas by heating the gas and reducing the drag force on suspended droplets. Carrier gas is supplied to a bubbler chamber wherein the carrier gas forms bubbles in a liquid chemical and volatilizes some of the liquid chemical. Carrier gas exiting the bubbler chamber is passed through a vaporizer unit that removes entrained liquid droplets from the carrier gas by slowing the flow velocity of the gas and bringing the gas into close contact with one or more high thermal mass surfaces that are held at an elevated temperature. These heated surfaces removed entrained droplets by a combination of impaction and evaporation.

BRIEF DESCRIPTION OF THE DRAWINGS

Other objects and advantages of the present invention will become apparent upon reading the detailed description of the invention and the appended claims provided below, and upon reference to the drawings, in which:

DETAILED DESCRIPTION OF THE INVENTION

Reference will now be made in detail to the embodiments of the invention, examples of which are illustrated in the accompanying drawings. While the invention will be described in conjunction with specific embodiments, it will be understood that they are not intended to limit the invention to those embodiments. The invention is intended to cover alternatives, modifications, and equivalents, which may be included within the spirit and scope of the invention as defined by the appended claims.

Figure 1:
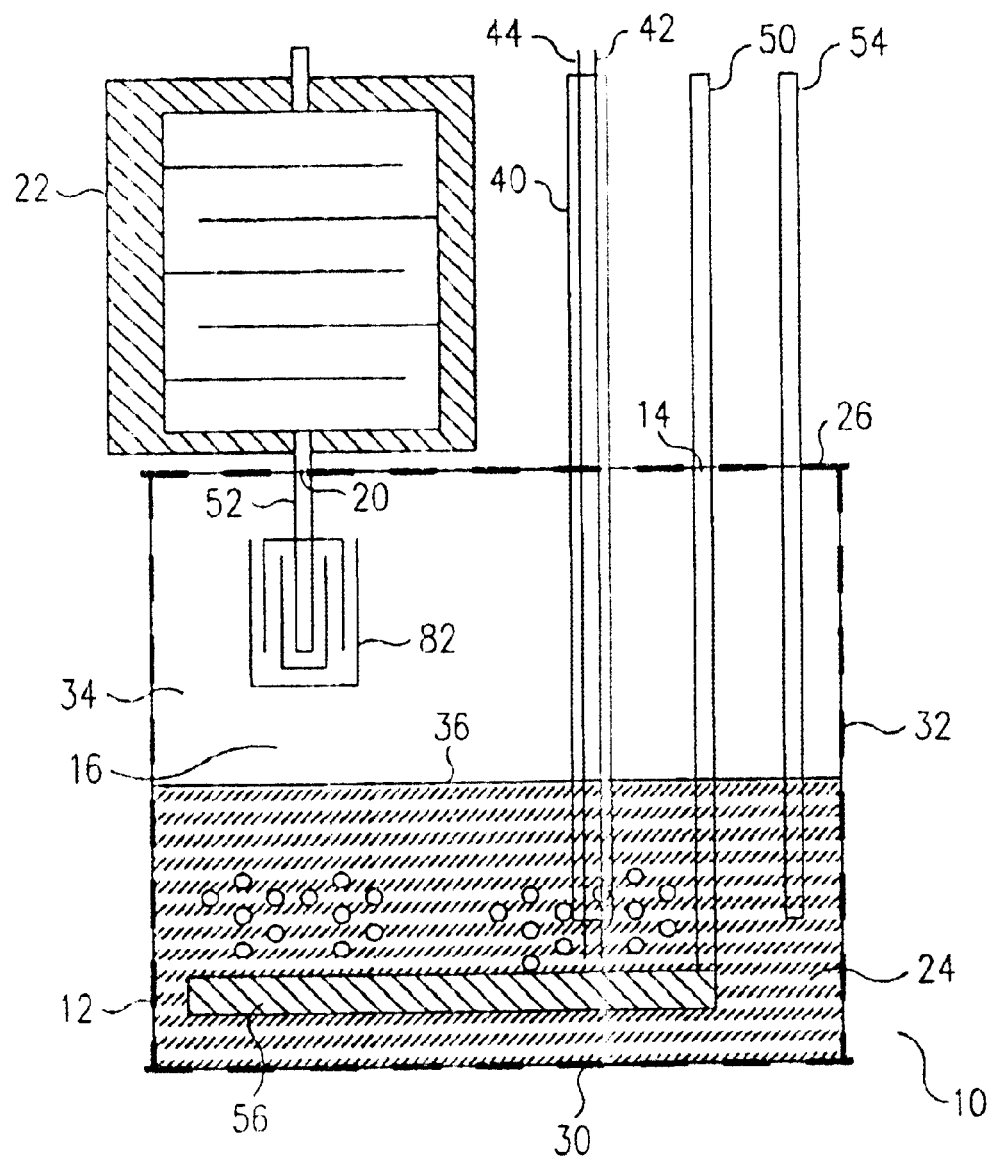
FIG. 1 is a schematic diagram of a bubbler system including the bubbler chamber and the liquid phase evaporator.

As illustrated in FIG. 1, the present invention provides a bubbler system 10 which generally includes a bubbler chamber 12 a gas inlet 14 providing carrier gas to the interior volume 16 of the bubbler chamber 12, a gas outlet 20 for conveying gas out of the bubbler chamber 12, and a vaporizer unit 22 attached to the gas outlet. More specifically, FIG. 1 shows a bubbler system incorporating a bubbler chamber 12 and a vaporizer unit 22 according to one illustrative embodiment of the present invention. The bubbler chamber 12 is provided for vaporizing a liquid chemical 24, contained within the bubbler chamber 12, by bubbling a carrier gas through the liquid chemical 24. The bubbler chamber 12 may be a sealed unit formed of stainless steel or another appropriately rugged, chemically inert material capable of withstanding pressurization. Preferably, the bubbler chamber 12 is formed in the shape of a cylindrical prism. However, any shape capable of withstanding a substantial internal pressure is feasible. A top wall piece 26, a bottom wall piece 30, and one or more side wall pieces 32 are assembled to enclose an interior volume 16. A sufficient volume of liquid chemical is provided to create a gas-filled headspace 34 above the gas-liquid interface 36 inside the interior volume 16. In this illustrative embodiment, a tube 40 is provided that penetrates the top wall piece 26 and extending into the interior volume 16 through which a thermocouple 42 is inserted to measure the temperature of the liquid chemical 24 and a probe 44 to monitor the volume of liquid chemical 24 in the interior volume 16.

At least three additional tubes penetrating the top wall piece 26 and extending into the interior volume 16 are preferably include . A gas inlet tube 50 passing through the gas inlet 14 supplies carrier gas to the interior volume 16 of the bubbler chamber 12. The gas inlet tube 50 terminates with one end submerged in the liquid chemical 24. A gas outlet tube 52 passes through the gas outlet 20. The first end of the gas outlet tube terminates above the gas-liquid interface 36 in the interior volume 22. The opposite, second end of the gas outlet tube 52 connects to the vaporizer unit 22 which is described in greater detail below. A liquid chemical inlet tube 54 is preferably provided for replenishing the liquid chemical in the interior volume 16 to allow continuous operation of the bubbler system 10 without the need to refill the liquid chemical reservoir as the chemical is evaporated into the flowing carrier gas stream. A gas dispersal device 56 is preferably attached to the gas inlet tube 50. In one embodiment of the current invention, the gas dispersal device 56 is a sparger tube or plate such as that described previously in U.S. Pat. No. 5,078,922, the disclosure of which is hereby incorporated by reference. In a preferred embodiment of the present invention, the gas dispersal device 56 is a porous plate formed of, for example, fritted quartz or silicon carbide or some similar material through which gas delivered by the carrier gas inlet tube 50 flows to create a large number of very small bubbles in the liquid chemical 24.

The liquid chemical inlet tube 54 is attached externally to a liquid chemical source (not shown). A liquid chemical controller (not shown) is operatively coupled to the liquid chemical inlet tube 54 and the probe 44 for monitoring the liquid chemical level. Flow of liquid chemical into the interior volume 16 through the liquid chemical inlet tube 54 may be controlled automatically by means of an electronic feedback system and the liquid chemical controller in response to the output of the probe 44 to maintain the gas-liquid interface 36 inside the interior volume 16 at an approximately constant level. The liquid chemical inlet tube 54 terminates inside the interior volume 16 at a level below the preferred minimum level of the gas-liquid interface 36. A liquid chemical controller and liquid level sensor probe suitable for use in the bubbler system of the present invention is described in U.S. Pat. No. 5,029,471, the disclosure of which is hereby incorporated by reference in its entirety.

The gas outlet tube 52 provides an exit path for carrier gas and entrained chemical vapors from the interior volume 16 of the bubble chamber 12. A vaporizer unit 22 having a large internal surface area of high thermal mass material held at an elevated temperature is provided. In general, the vaporizer unit 22 is designed to trap and evaporate any liquid droplets that may be contained in the vapor mixture. Therefore one function of such device is to maximize heat transfer to the gas flowing through it. As such, it is preferred that the interior volume of the vaporizer unit be large enough relative to the flow rate of the gas exiting the bubbler chamber 12 to provide a substantial residence time for the gas in the vaporizer unit 22. It is preferred that the residence time of gas in the flow chamber be sufficiently long relative to the rate of heat transfer from the flow chamber surfaces to the gas to allow the gas to substantially approach the temperature of the flow chamber before exiting the flow chamber. The appropriate flow chamber volume, gas flow rate, and flow chamber heat transfer surface area to accomplish the stated objectives of the present invention may be readily determined by one of ordinary skill in the art using standard engineering principles and the teachings contained herein.

A further object of the vaporizer unit is to enhance gravitational settling of entrained liquid droplets by reducing the drag force on suspended particles. The drag force on mechanically generated particles, such as entrained droplets formed by splashing of a liquid, in a rapidly moving fluid is proportional to the square of the gas velocity, $V_{gas}$ (m/s), as shown below:

$$F_{Drag} = \frac{1}{2} \cdot \rho \cdot C_d \cdot V_{Gas}^2 \tag{2}$$

where $\rho$ is the fluid density (kg m$^{-3}$), $C_d$ is the drag coefficient which is proportional to the droplet diameter, and F (N) is the drag force exerted on the particle due to the moving flow. The velocity of a gas moving at a given flow rate is inversely proportional to the cross sectional flow area perpendicular to the gas flow direction. As equation 2 shows, the drag force varies as the square of the gas velocity. Therefore, the drag force on a suspended liquid droplet in a moving fluid, such as for example a carrier gas, is inversely dependent on the square of the cross sectional flow area. One of ordinary skill in the art can readily determine the appropriate cross sectional area of the flow chamber necessary to substantially remove entrained droplets of a given diameter based on the teachings herein and routine experimentation.

Figure 2:
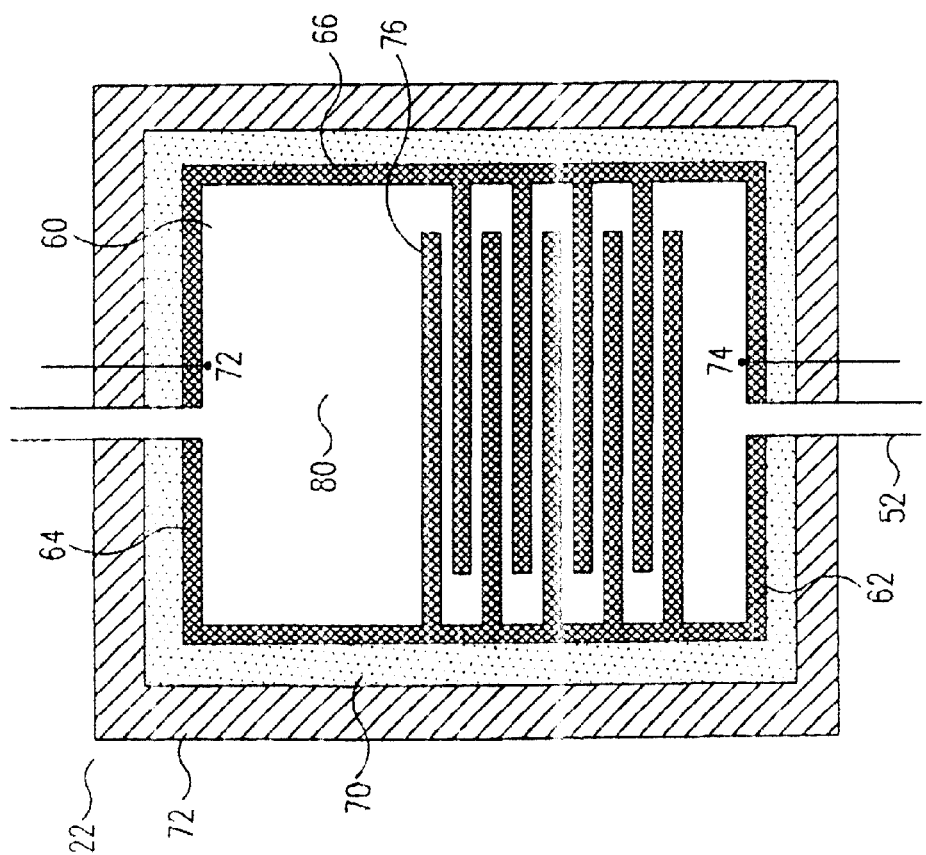
FIG. 2 is an enlarged schematic diagram of an embodiment of the liquid phase evaporator of the present invention.

A preferred embodiment of the vaporizer unit 22 is shown in greater detail in FIG. 2. This evaporator unit 22 is formed of a flow chamber 60 with a large cross sectional area perpendicular to the direction of flow mounted on the second end of the gas outlet tube 52. The gas outlet tube penetrates the bottom end wall 62 of the flow chamber 60 which is enclosed by a top wall 64, and at least one side wall 66. The flow chamber 60 is preferably formed of a high thermal mass, heat-conducting material such as for example, a metal. A heating element 70 surrounds the flow chamber 60. To assure good heat transfer between the heating element 70 and the flow chamber 60, an insulating layer 72 is provided on the outside surface of the heating element 70. In one embodiment of the invention, a top thermocouple 72 and a bottom thermocouple 74 thermally attached to the chamber wall proximate or on the top end wall 64 and proximate or on the bottom end wall 62, respectively, provide feedback for controlling the heating element 70 to maintain the flow chamber 60 at the proper temperature. The temperature of the flow chamber 60 is preferably maintained below approximately 250° C. to prevent damage to other components of the system. More preferably, the temperature of the flow chamber 60 is maintained in the range of approximately 85 to 200° C. Most preferably when the bubbler system of the present invention is used for delivery of tetraethyl orthosilicate (TEOS) to a CVD system the temperature is approximately 150° C. The temperature difference between the top thermocouple 72 and the bottom thermocouple 74 provide information on how much heat is transferred to the fluid passing through the vaporizer.

A series of baffle plates 76 are preferably arranged inside the flow chamber 60 disposed perpendicularly to the direction of gas flow through the flow chamber 60. These baffle plates 76 are formed from a high thermal mass, heat conducting material such as is used for the walls of the flow chamber 60. The baffle plates 76 are thermally coupled to the walls of the flow chamber 60. The baffle plates 76 may be cross-drilled with penetrating holes (not shown) to allow gas to pass through them. Preferably, the penetrating holes in successive baffle plates 76 are offset to lengthen the carrier gas flow path through the flow chamber. Alternatively, the baffle plates may be mounted with offset gaps or slots such that gas must flow around or through them to traverse the inside of the flow chamber 60. An open volumetric space 80 may be provided within the flow chamber downstream of the region occupied by the baffle plates 76. This open volumetric space 80 provides capacitance and dampening of the gas flow and smooths the ramp up and ramp down response of the system when gas flows are cycled on and off for non-continuous flow applications such as single wafer deposition.

The cross sectional area of the flow chamber 60 is sufficiently larger than that of the vapor outlet tube 52 to slow the flow of gas exiting from the bubbler chamber 12 and thereby enhance gravitational settling of suspended liquid droplets in the flow chamber. Further removal of suspended droplets is achieved by volatilization due to the heat input to gas in the flow chamber transmitted through the heat-conducting material of the flow chamber walls and the baffle plates 76 from the temperature-controlled heat source 70.

Alternative configurations of the vaporizer unit 22 are also possible. For example, the flow chamber may be formed in the shape of a cone or with a tapering top or bottom wall to promote laminar flow and avoid the occurrence of recirculation zones in the flow chamber 60. Additionally, the baffle plates may be formed without penetrating holes but instead be attached to alternating sides of the flow chamber such that gas flowing through the chamber is caused to follow a "zig-zag" pattern in which is in close contact with many successive baffle plates. A range of potential shapes and alternative configurations may be envisioned by one of skill in the art based on the teachings herein. The common features of these alternative embodiments are a flow chamber structure that slows the gas velocity to promote gravitational settling of entrained droplets while bringing the gas in sufficiently close contact with high thermal mass heated surfaces of the flow chamber for a sufficiently long residence time to raise the temperature of the gas to at or near the flow chamber temperature prior to the gas exiting the chamber.

Figure 3:
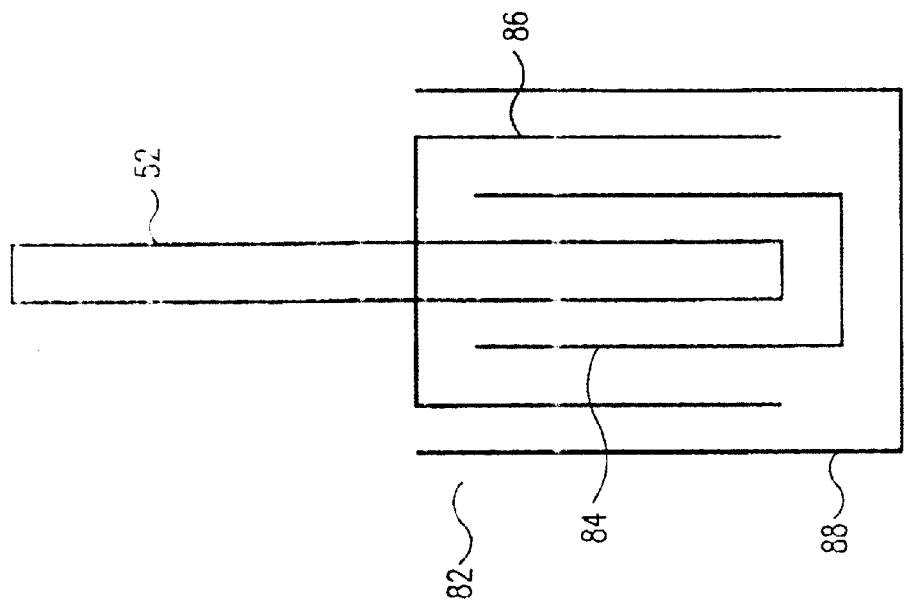
FIG. 3 is a schematic diagram of a bubbler system including the bubbler chamber, liquid phase evaporator, and internal baffle.

In another embodiment of the present invention illustrated in FIG. 3, the vapor outlet tube 52 is attached to an internal baffling device 82 mounted inside the headspace 34 inside the bubbler chamber 12. The gas outlet tube 52 is surrounded but not contacted by an axially aligned first cup 84 that has an open end and a closed end. The open end of the first cup 84 opens toward the top wall piece 26. A second axially aligned cup 86 with an open end and a closed end oriented such that the open end is directed toward the bottom wall piece 30 of the bubbler chamber 12 is mounted to surround the first cup 84. The inner cross sectional area of the first cup 84 is slightly larger than the outer cross sectional area of the gas outlet tube 52, and the inner cross sectional area of the second cup 86 is slightly larger than the outer cross sectional area of the first cup 84. Nesting of the first 84 and second 86 cups mounted axially on the gas outlet tube 52 provides a series of connected annular passageways that form a tortuous path through which gas exiting the interior volume 16 must flow. Liquid droplets suspended in the exiting gas stream are removed by impaction on the surfaces of the internal baffle 82. In an alternative embodiment of the internal baffle 82, additional cups (a third cup 88 is shown in FIG. 3) may be added to provide added distance to the tortuous flow path. Each cup has an inner cross sectional area slightly larger than the outer cross sectional area of the cup it surrounds, and each successive cup is mounted with its open end pointing in the opposite direction to the previous cup. In a preferred embodiment, the cups are cylindrical in shape and the gas outlet tube is also cylindrical and the gap between the gas outlet tube and the first cup 84 and between successive cups is in the range of approximately 0.5 mm to 5 mm.

In an alternative embodiment, the vaporizer unit of the present invention may be used to pre-heat or post-heat process gases containing a condensible vapor. For example, in a chemical vapor deposition system, gases may be pre-heated prior to entering a bubbler chamber or prior to being fed to a direct liquid injector system as discussed above. In this embodiment, the vaporizer unit as described in one of the embodiments described above, is positioned in-line with a process gas flow path. Gas flows through the flow chamber 60 as described above in the bubbler embodiment. Large liquid droplets are removed by gravitational settling as the gas velocity drops due to the enlarged cross sectional area of the flow chamber 60. Heat transfer from the high thermal mass interior surfaces elevates the gas temperature, serving to both evaporate currently entrained droplets and to maintain the gas at a sufficient temperature to avoid condensation of vapor phase chemicals at some downstream location in the gas processing path.

The foregoing description of specific embodiments and examples of the invention have been presented for the purpose of illustration and description, and although the invention has been illustrated by certain of the preceding examples, it is not to be construed as being limited thereby. They are not intended to be exhaustive or to limit the invention to the precise forms disclosed, and obviously many modifications, embodiments, and variations are possible in light of the above teaching. It is intended that the scope of the invention encompass the generic area as herein disclosed, and by the claims appended hereto and their equivalents.

EXPERIMENTAL

A number of experiments were conducted according the method and system of the present invention. The two examples provided demonstrate the improved performance provided by the present invention. These experiments are intended for illustration purposes only, and are not intended to limit the scope of the present invention in any way.

EXAMPLE 1

Figure 4:
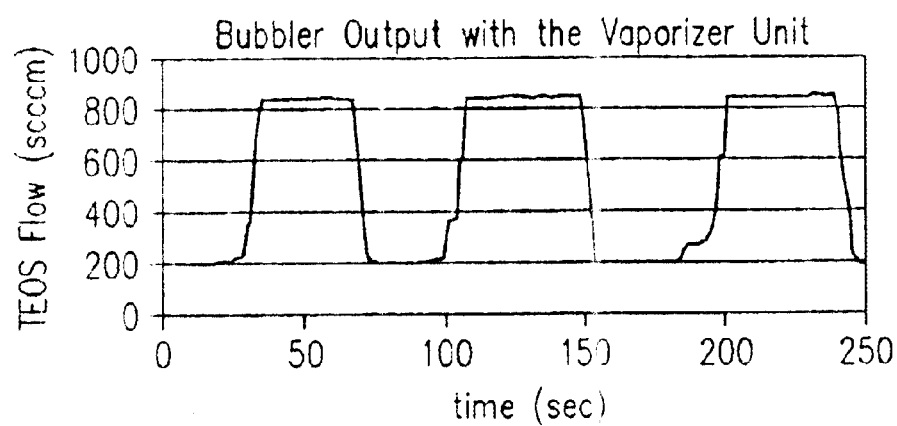
FIG. 4 is a chart showing the flow rate of liquid TEOS from a bubbler chamber according to the present invention in which the system is operated in intermittent flow mode: 30 seconds with flow on, 30 seconds with flow off.
Figure 5:
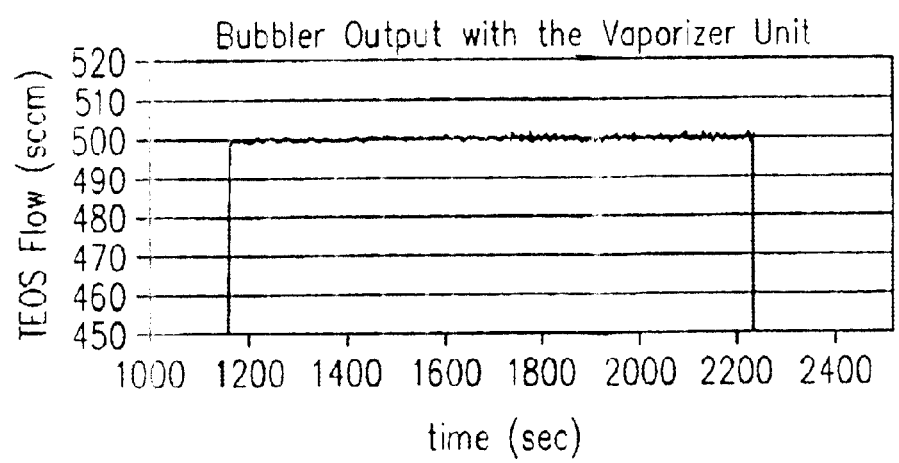
FIG. 5 is a chart showing the flow rate of liquid TEOS into a bubbler chamber according to the present invention in which the system is operated in constant flow mode.

In this example, a bubbler system according to the present invention including a bubbler chamber, a vaporizer unit with baffle plates, a porous fritted plate gas delivery device, and automated liquid chemical replenishment was operated in intermittent mode. The carrier gas flow rate, $Q_{Carrier\ Gas}$ in equation 1, was varied on a 30 second duty cycle to simulate use of the bubbler to supply tetraethyl orthosilicate to a single wafer chemical vapor deposition tool. Carrier gas flow was increased to approximately 20 slm and then reduced to approximately 5 slm on this cycle. The results shown in FIG. 4 illustrate that the TEOS output, measured in seem, responded rapidly to the changing carrier gas flow conditions and achieved a new steady state within approximately 5 seconds. For comparison, prior art bubblers typically operate at less than 1 slm carrier gas flow rates to prevent entrainment of liquid droplets. The stable and constant TEOS output shown in FIG. 4 demonstrates that entrainment is not an issue with the bubbler system of the present invention at carrier gas flow rates of at least 20 slm.

EXAMPLE 2

In this example, a bubbler system according to the present invention including a bubbler chamber, a vaporizer unit with baffle plates, a porous fritted plate gas delivery device, and automated liquid chemical replenishment was operated in constant carrier gas flow rate mode. The carrier gas flow was maintained at approximately 10 slm for over 15 minutes during which the bubbler system produced a stable, constant TEOS delivery rate of approximately 500 sccm over a prolonged operation period. Prior art bubblers are typically incapable of TEOS delivery at rates above approximately 200 to 300 sccm.

What is claimed is:

1. A high flow rate bubbler system comprising:
   a bubbler chamber containing a liquid chemical;
   a gas inlet for delivering a carrier gas to the liquid chemical inside said bubbler chamber
   a gas outlet for conveying the carrier gas and chemical vapors out of said bubbler chamber; and
   a vaporizer unit through which carrier gas and chemical vapors exiting said bubbler chamber pass, said vaporizer unit comprising one or more heated surfaces of substantial thermal mass oriented such that gases passing through said vaporizer unit contact said heated surfaces for a sufficient time to remove entrained liquid droplets, and said vaporizer unit having a substantial cross sectional area perpendicular to the direction of gas flow such that the gas velocity is substantially slowed;
   wherein the vaporizer unit comprises a flow chamber and a gas outlet tube having a first end and a second end, said first end is connected to and penetrates through said gas outlet into said bubbler chamber, said second end penetrates a bottom end wall of the flow chamber to provide a flow path for said carrier gas and chemical vapors to pass from said bubbler chamber into said flow chamber, and said first end is protected by a baffling device;

wherein said baffling device comprises at least a first cup having an open end and a closed end, said first cup being aligned axially and concentrically with said gas outlet tube and positioned with the open end facing upward such that the first end of said gas outlet tube passes through the open end of said first cup but does not touch the closed end of said first cup; and at least a second cup having an open end and a closed end, said second cup being aligned axially and concentrically with said gas outlet tube and positioned with the open end facing downward such that the open end of said first cup passes through the open end of said second cup but does not touch the closed end of said second cup.

2. The high flow rate bubbler system of claim 1 where said bubbler chamber further comprises:

a top wall piece, a bottom wall piece, and one or more side wall pieces sufficient to enclose an interior volume.

3. The high flow rate bubbler system of claim 2 wherein:

said interior volume contains a volume of the liquid chemical and a volume of gas separated by a liquid-gas interface, and said volume of the liquid chemical is sufficiently smaller than said interior volume of said bubbler chamber to provide a substantial headspace between the liquid-gas interface and said top wall piece.

4. The high flow rate bubbler of claim 3 further comprising:

a liquid chemical inlet tube penetrating said top wall piece, said liquid chemical inlet tube extending into said interior volume sufficiently to terminate below the liquid-gas interface; said liquid chemical inlet tube providing the liquid chemical from a liquid chemical source to said interior volume.

5. The high flow rate bubbler system of claim 3 wherein said gas inlet further comprises:

a gas inlet tube penetrating said top wall piece, said gas inlet tube providing carrier gas from a gas source to said interior volume, said gas inlet tube being attached to a gas dispersal device disposed proximate said bottom wall piece of said bubbler chamber within said interior volume.

6. The high flow rate bubbler system of claim 5 wherein said gas dispersal device comprises a plate formed of a porous material, said porous plate providing a plurality of flow paths for carrier gas and dispensing carrier gas into the liquid chemical in the form of a plurality of bubbles.

7. The high flow rate bubbler system of claim 3 wherein said gas outlet further comprises:

a vapor outlet tube having a first end and a second end, said vapor outlet tube penetrating said top wall piece such that said first end is positioned within said bubbler chamber terminating above the liquid-gas interface in the headspace and said second end protrudes outside of said bubbler chamber, said vapor outlet tube providing a flow path to exhaust carrier gas and chemical vapors out of said interior volume.

8. The high flow rate bubbler system of claim 1 wherein said flow chamber further comprises:

a plurality of baffle plates disposed perpendicularly to the direction in which carrier gas flows through said vaporizer unit, said baffle plates having one or more offset penetrating holes that allow gas to flow through said flow chamber; and an evaporator outlet flow tube, said evaporator outlet flow tube penetrating a top end wall of the flow chamber to provide an outlet flow path for carrier gas exiting said flow chamber.

9. The bubbler system of claim 8 wherein said flow chamber and said baffle plates are formed of a heat conducting material and are thermally coupled to a temperature-controlled heat source, said temperature-controlled heat source maintaining said top end wall, said bottom end wall, said at least one side wall and said baffle plates at an elevated temperature.

10. The bubbler system of claim 9 wherein said elevated temperature is less than 250° C.

11. The bubbler system of claim 9 wherein said elevated temperature is between 85° C. and 200° C.

12. The bubbler system of claim 9 wherein said temperature-controlled heat source is controlled in response to one or more thermocouples thermally attached to said flow chamber.

13. The bubbler system of claim 12 wherein a first of said or more thermocouples is thermally attached to said flow chamber proximate said top wall and a second of said one or more thermocouples is thermally attached to said flow chamber proximate said bottom wall.

14. The bubbler system of claim 13 wherein said temperature-controlled heat source provides heat to said flow chamber such that the temperatures measured by said first thermocouple and said second thermocouple do not differ by more than approximately 50° C.

15. The bubbler system of claim 8 wherein said flow chamber further comprises an open volumetric head space downstream of said baffle plates.

16. The bubbler system of claim 4 further comprising:

a device for determining the amount of liquid remaining in the bubbler chamber and generating an output signal responsive to said amount; and a liquid chemical controller operatively coupled to said bubbler and said liquid chemical inlet tube for filling and continuously maintaining a level of the liquid chemical said chamber responsive to said output signal.

17. The bubbler system of claim 1 wherein said enclosed bubbler chamber is formed to enclose an interior volume with the shape of a cylindrical prism.

18. A chemical vapor deposition system wherein precursor chemical vapors are provided by the bubbler system of claim 1.

19. A chemical vapor deposition system wherein precursor chemical vapors are provided by the bubbler system of claim 8.

* * * * *